(12) United States Patent
Lin et al.

(10) Patent No.: US 8,330,735 B2
(45) Date of Patent: Dec. 11, 2012

(54) CAPACITIVE TOUCH CIRCUIT

(75) Inventors: Chien-Liang Lin, Hsin Chu (TW);
Chun-Yen Chiu, Miao Li County (TW)

(73) Assignee: Sonix Technology Co., Ltd., Chupei, Hsinchu (TW)

( * ) Notice: Subject to any disclaimer, the term of this patent is extended or adjusted under 35 U.S.C. 154(b) by 553 days.

(21) Appl. No.: 12/575,830

(22) Filed: Oct. 8, 2009

(65) Prior Publication Data

US 2011/0011717 A1    Jan. 20, 2011

(30) Foreign Application Priority Data

Jul. 14, 2009   (TW) .............................. 98123675 A

(51) Int. Cl.
*G06F 3/041*   (2006.01)
(52) U.S. Cl. ...................... 345/173; 345/174; 178/18.06; 178/18.07; 200/600; 463/37; 341/33
(58) Field of Classification Search .......... 345/174–178; 178/18.06, 18.07; 463/37–38; 324/658, 324/686; 200/600, 5 R; 341/33
See application file for complete search history.

(56) References Cited

U.S. PATENT DOCUMENTS

| | | | |
|---|---|---|---|
| 3,742,384 A | | 6/1973 | Breitzmann et al. |
| 5,670,915 A | * | 9/1997 | Cooper et al. ............... 331/111 |
| 6,466,036 B1 | | 10/2002 | Philipp |
| 7,023,221 B1 | | 4/2006 | Lin |
| 7,307,485 B1 | | 12/2007 | Snyder et al. |
| 7,368,963 B2 | | 5/2008 | Lee |
| 7,489,529 B2 | | 2/2009 | Yang |
| 2003/0030499 A1 | * | 2/2003 | Huang et al. ................... 331/111 |
| 2008/0111714 A1 | * | 5/2008 | Kremin ........................... 341/33 |
| 2009/0065268 A1 | * | 3/2009 | Katsurahira ............... 178/19.01 |

FOREIGN PATENT DOCUMENTS

| | | |
|---|---|---|
| CN | 1794580 A | 6/2006 |
| CN | 1980029 A | 6/2007 |
| JP | 58-073228 | 5/1983 |

* cited by examiner

*Primary Examiner* — Lun-Yi Lao
*Assistant Examiner* — Saiful A Siddiqui
(74) *Attorney, Agent, or Firm* — Muncy, Geissler, Olds & Lowe, PLLC

(57) ABSTRACT

A capacitive touch circuit includes a single comparator, a reference voltage control unit, a resistance adjusting unit, a delay unit, and a relaxation oscillation control unit. The comparator has a first input terminal, a second input terminal, and an output terminal. The reference voltage control unit is electrically connected to the second input terminal and includes a high level voltage source, a low level voltage source, and a voltage switching controller. The voltage switching controller electrically connects either the high level voltage source or the low level voltage source to the second input terminal of the single comparator according to an output signal of the single comparator. The relaxation oscillation control unit is electrically connected to the resistance adjusting unit, the delay unit, and the reference voltage control unit. The relaxation oscillation control unit outputs a relaxation oscillation signal, and the frequency of the relaxation oscillation signal varies according to the resistance set by the resistance adjusting unit.

18 Claims, 4 Drawing Sheets

CAPACITIVE TOUCH CIRCUIT

CROSS REFERENCE TO RELATED APPLICATION

This application claims priority of application No. 098123675 filed on Jul. 14, 2009 in Taiwan R.O.C under 35 U.S.C. §119; the entire contents of which are hereby incorporated by reference.

BACKGROUND OF THE INVENTION

1. Field of the Invention

The invention relates to a capacitive touch circuit.

2. Description of the Related Art

Nowadays, a capacitance sensor is widely used in different touch sensing devices such as a capacitive touch key, a touch panel, etc. Since different touch sensing applications have their respective suitable detection ranges of capacitance, and a suitable detection range of capacitance also varies according to the environmental condition, an external compensation device such as an external capacitor or resistor is used in the conventional design to vary the RC constant and hence the impedance of a relaxation oscillator. As a result, in order to obtain an optimum detection range suitable for different touch sensing applications and different environmental conditions, many capacitors or resistors having different values must be provided to improve the accuracy of capacitive touch sensing. Hence, the fabrication costs are increased and the adjustment to the impedance of the relaxation oscillator is inflexible. Further, in the conventional design, two comparators are used to perform charge and discharge operations for the relaxation oscillator to result in a complicated architecture of a touch sensing circuit.

BRIEF SUMMARY OF THE INVENTION

The invention provides a capacitive touch circuit capable of overcoming the disadvantages in conventional designs.

According to an embodiment of the invention, a capacitive touch circuit includes a single comparator, a reference voltage control unit, a resistance adjusting unit, a delay unit, and a relaxation oscillation control unit. The comparator has a first input terminal, a second input terminal, and an output terminal. The reference voltage control unit is electrically connected to the second input terminal and includes a high level voltage source, a low level voltage source, and a voltage switching controller. The voltage switching controller electrically connects either the high level voltage source or the low level voltage source to the second input terminal of the single comparator according to an output signal of the single comparator. The resistance adjusting unit is electrically connected to the first input terminal of the single comparator, and the delay unit is electrically connected to the output terminal of the single comparator for filtering out the transition of the output signal. The relaxation oscillation control unit is electrically connected to the resistance adjusting unit, the delay unit, and the reference voltage control unit. The relaxation oscillation control unit outputs a relaxation oscillation signal, the relaxation oscillation signal is fed into the first input terminal of the single comparator, and the frequency of the relaxation oscillation signal varies according to the resistance set by the resistance adjusting unit.

According to the above embodiment, charge and discharge operations are performed only as a single comparator and two voltage sources are provided. Hence, the architecture of the capacitive touch circuit is considerably simplified. Further, since the resistance adjusting unit is allowed to adjust the RC constant and hence the impedance of the relaxation oscillation control unit, accurate capacitive touch sensing is always achieved under different environmental conditions and touch sensing applications, without the need of an external compensation device. Hence, the fabrication costs can be further reduced. Besides, through the design of the delay unit, the comparator may output signals with hysteresis to effectively eliminate unstable signal transition.

According to another embodiment of the invention, a capacitive touch circuit includes a single comparator, a reference voltage control unit, a delay unit, and a relaxation oscillation control unit. The single comparator has a first input terminal, a second input terminal, and an output terminal. The reference voltage control unit is electrically connected to the second input terminal and includes a high level voltage source group, a high level voltage selector, a low level voltage source group, a low level voltage selector, and a voltage source group switching controller. The high level voltage source group provides multiple different high reference voltages, and the high level voltage selector selects one of the high reference voltages and feeds the selected high reference voltage into the second input terminal of the single comparator. The low level voltage source group provides multiple different low reference voltages, and the low level voltage selector selects one of the low reference voltages and feeds the selected low reference voltage into the second input terminal of the single comparator. The voltage source group switching controller electrically connects either the high level voltage source group or the low level voltage source group to the second input terminal of the single comparator according to an output signal of the single comparator. The delay unit electrically is connected to the output terminal of the single comparator for filtering out the transition of the output signal. The relaxation oscillation control unit is electrically connected to the delay unit and the reference voltage control unit. The relaxation oscillation control unit outputs a relaxation oscillation signal that is fed into the first input terminal of the single comparator, and the frequency and the amplitude of the relaxation oscillation signal vary according to a high reference voltage and a low reference voltage that are selected by the reference voltage control unit and fed into the second input terminal of the single comparator.

According to the multi-level design of the above embodiment, the output waveform of the relaxation oscillation control unit can be adjusted even the resistance adjusting unit is omitted. Thereby, high and low reference voltages can be freely selected according to different environmental conditions and touch sensing applications to obtain an optimum frequency of the relaxation oscillation signal.

Other objectives, features and advantages of the present invention will be further understood from the further technological features disclosed by the embodiments of the present invention wherein there are shown and described preferred embodiments of this invention, simply by way of illustration of modes best suited to carry out the invention.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and variations thereof herein are used broadly and encompass direct and indirect connections, couplings, and mountings. Similarly, "adjacent to" and variations thereof herein are used broadly and encompass directly and indirectly "adjacent to". Therefore, the description of "A" component "adjacent to" "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
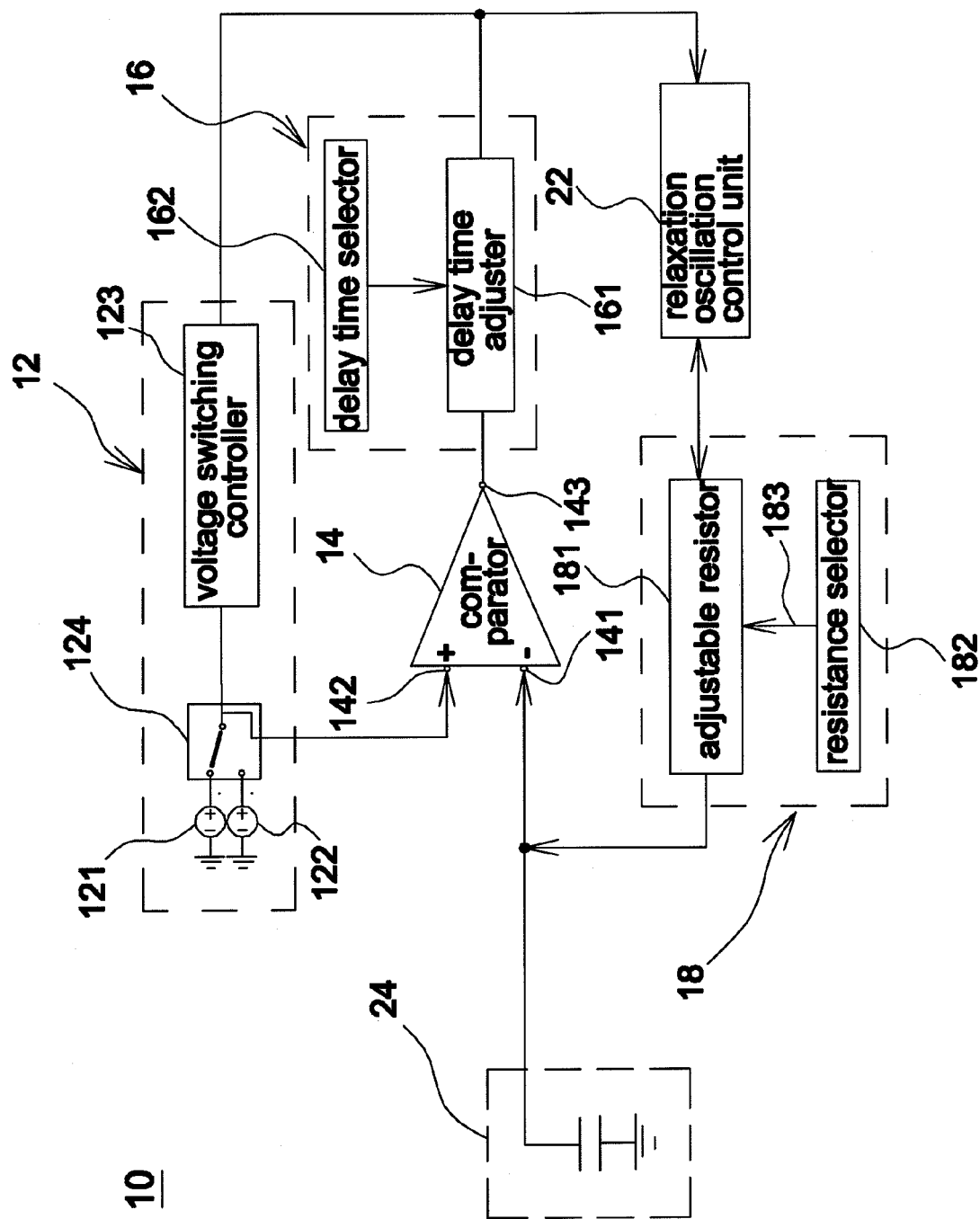
FIG. 1 shows a schematic diagram illustrating a capacitive touch circuit according to an embodiment of the invention.

FIG. 1 shows a schematic diagram illustrating a capacitive touch circuit according to an embodiment of the invention. Referring to FIG. 1, the capacitive touch circuit 10 includes a reference voltage control unit 12, a comparator 14, a delay unit 16, a resistance adjusting unit 18, and a relaxation oscillation control unit 22.

Figure 2:
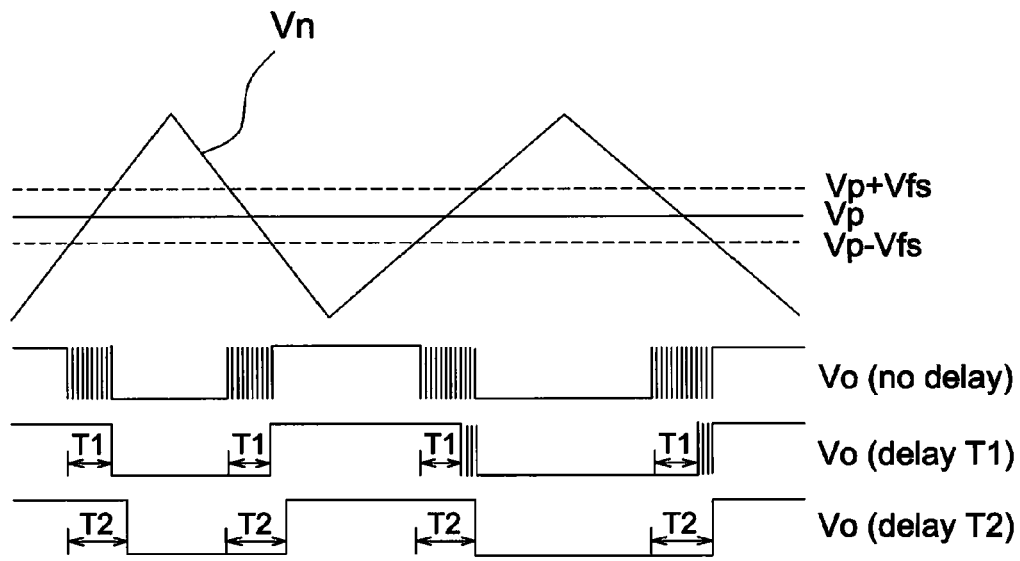
FIG. 2 shows waveform diagrams illustrating the output of a comparator under different delay time lengths.

The comparator 14 has a negative input terminal 141, a positive input terminal 142, and an output terminal 143. The negative input terminal 141 is electrically connected to the resistance adjusting unit 18 and a capacitance sensor 24, the positive input terminal 142 is electrically connected to the reference voltage control unit 12, and the output terminal 142 is electrically connected to the delay unit 16. As shown in FIG. 2, the comparator 14 compares a voltage Vn at the negative input terminal 141 with a voltage Vp at the positive input terminal 142 and outputs a voltage Vo in the form of a square wave via the output terminal 143. In this embodiment, the output voltage Vo is in a logic-high level when the input voltage Vp>Vn, and the output voltage Vo is in a logic-low level when the input voltage Vp<Vn.

The reference voltage control unit 12 includes a high level voltage source 121, a low level voltage source 122, and a voltage switching controller 123. The high level voltage source 121 and the low level voltage source 122 are used to respectively perform a charge operation and a discharge operation for an RC circuit. The voltage switching controller 123 uses a switch 124 to switch between the high level voltage source 121 and the low level voltage source 122 according to an output signal of the comparator 14.

The delay unit 16 is used to eliminate the transition of an output signal of the comparator 14. In other words, the delay unit 16 is allowed to generate an output signal with hysteresis. The delay unit 16 includes a delay time adjuster 161 and a delay time selector 162. The delay time selector 162 decides a delay time length according to the transition duration of an output signal of the comparator 14, and the delay time adjuster 161 delays the start of the transition of the output signal of the comparator 14 according to the delay time length. Specifically, as shown in FIG. 2, the signal transition exists on an occasion that a difference between the input voltage Vn and the input voltage Vp is smaller than an offset voltage Vfs of the comparator 14. Further, longer transition duration may exist as the slew rate of the output signal of the comparator 14 is comparatively low. As a first edge of the output signal triggers a counter in the delay time adjuster 161 to count, the delay time selector 162 informs the counter about the correct delay time length to completely eliminate the unstable signal transition. FIG. 2 shows three output square waveforms. As shown in FIG. 2, a delay time length T1 only eliminates partial signal transition, and thus the delay time selector 162 may set a longer delay time length T2 to completely eliminate the signal transition. The delay time selector 162 may be a read only memory (ROM), a random access memory (RAM), or a register, and the delay time length may be controlled by firmware and assembly programming.

Figure 3:
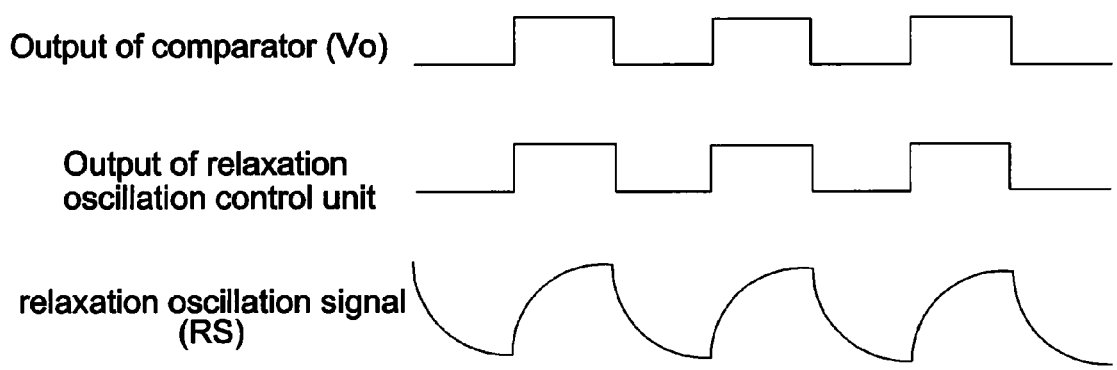
FIG. 3 shows waveform diagrams illustrating the output of a comparator, the output of a relaxation oscillation control unit, and a relaxation oscillation signal.

The resistance adjusting unit 18 includes an adjustable resistor 181 and a resistance selector 182, and the adjustable resistor 181 may include a variable resistance. The adjustable resistor 181 and an external capacitance sensor 24 constitute an RC circuit, and the capacitance measured by the capacitance sensor 24 varies according to whether or not a user touches a capacitive touch key. The resistance of the adjustable resistor 181 is adjusted to vary the oscillation frequency of the RC circuit. As the resistance increases, the oscillation frequency of the RC circuit becomes lower. On the contrary, as the resistance decreases, the oscillation frequency of the RC circuit becomes higher. In one embodiment, the resistance selector 182 has an N-bit (N is a positive integer) architecture to allow the adjustable resistor 181 to have $2^N$ adjusting levels. For example, the adjustable resistor 181 has two adjusting levels as N=1, and the adjustable resistor 181 has 256 adjusting levels as N=8. The adjustable resistor 181 is electrically connected to the resistance selector 182 through a bus 183. The resistance selector 182 may be a read only memory (ROM), a random access memory (RAM), or a register and may be controlled by firmware and assembly programming. The relaxation oscillation control unit 22 is electrically connected to the resistance adjusting unit 18, the delay unit 16, and the reference voltage control unit 12. The relaxation oscillation control unit 22 induces RC oscillation according to the output signal with hysteresis of the comparator 14. Specifically, as shown in FIG. 3, when the relaxation oscillation control unit 22 detects that the output voltage Vo of the comparator 14 is in a logic-high level, the relaxation oscillation control unit 22 outputs a logic-high voltage to charge the RC circuit. In comparison, when the relaxation oscillation control unit 22 detects that the output voltage Vo of the comparator 14 is in a logic-low level, the relaxation oscillation control unit 22 outputs a logic-low level voltage to enable the RC circuit to discharge. After a cycle of charge and discharge operations, the relaxation oscillation control unit 22 generates a relaxation oscillation signal RS, as shown in FIG. 3. The relaxation oscillation signal RS is fed into the negative input terminal 141 to be compared with a reference voltage that is electrically connected to the positive input terminal 142 of the comparator 14. In this embodiment, a high level reference voltage $V_H$ output by the high level voltage source 121 is equal to an upper threshold voltage for charging the RC circuit, and a low level reference voltage $V_L$ output by the low level voltage source 122 is equal to a lower threshold voltage for discharging the RC circuit.

Referring to FIG. 2 again, when the relaxation oscillation control unit 22 charges the RC circuit, the voltage Vn at the negative input terminal of the comparator 14 continually increases, and the voltage switching controller 123 switches to the high level voltage source 121 to enable the voltage Vp at the positive input terminal of the comparator 14 to equal the high level reference voltage $V_H$. At the instant when the voltage Vn at the negative input terminal increases to larger than the voltage Vp at the positive input terminal (at this time Vp=$V_H$), the output voltage Vo of the comparator 14 is immediately changed to a logic-low level, and the voltage switching controller 123 switches to the low level voltage source 122 to enable the voltage Vp at the positive input terminal to equal the low level reference voltage $V_L$. Meanwhile, when the relaxation oscillation control unit 22 detects that the output voltage Vo of the comparator 14 is in a logic-low level, the relaxation oscillation control unit 22 turns to output a voltage in a logic-low level to enable the RC circuit to discharge.

When the RC circuit discharges, the voltage Vn at the negative input terminal of the comparator 14 continually decreases, and meanwhile the voltage Vp at the positive input terminal of the comparator 14 equals the low level reference voltage $V_L$. At the instant when the voltage Vn at the negative input terminal decreases to smaller than the voltage Vp at the positive input terminal (at this time Vp=$V_L$), the output voltage Vo of the comparator 14 turns to have a logic-high level, and the voltage switching controller 123 switches to the high level voltage source 121 to enable the voltage Vp at the positive input terminal to equal the high level reference voltage $V_H$. As a result, the RC circuit is allowed to alternately charge and discharge, and meanwhile the voltage switching controller 123 correspondingly switches between the high level voltage source 121 and the low level voltage source 122 to enable the relaxation oscillation control unit 22 to output the signal RS shown in FIG. 3.

In this embodiment, charge and discharge operations are performed only as a single comparator and two voltage sources are provided. Hence, the architecture of the capacitive touch circuit is considerably simplified. Further, since the resistance adjusting unit 18 is allowed to adjust the RC constant and hence the impedance of the relaxation oscillation control unit 22, accurate capacitive touch sensing is always achieved under different environmental conditions and touch sensing applications, without the need of an external compensation device. Hence, the fabrication costs can be further reduced. Besides, through the design of the delay unit 16, the comparator 14 may output signals with hysteresis to effectively eliminate unstable signal transition.

Figure 4:
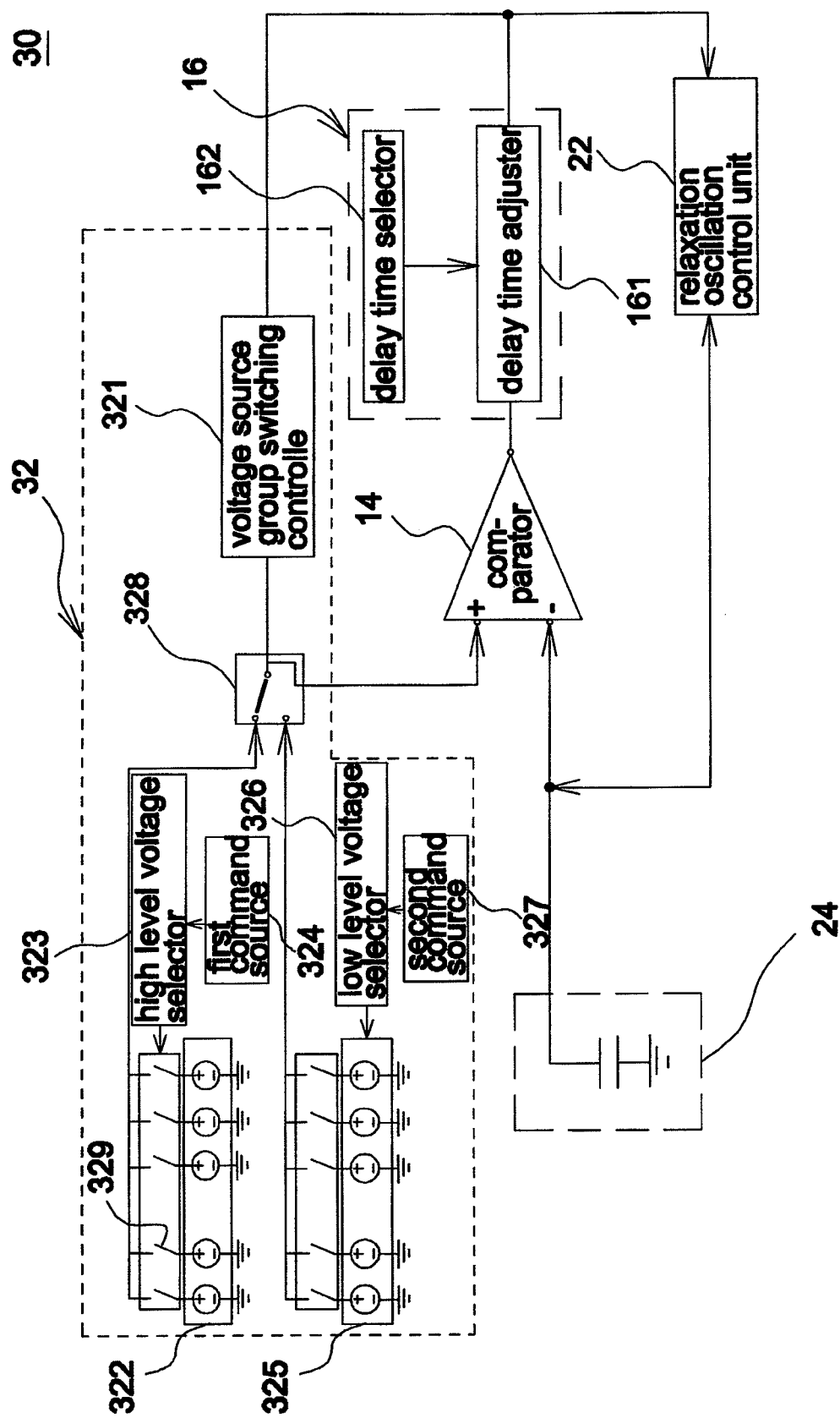
FIG. 4 shows a schematic diagram according to another embodiment of the invention.

FIG. 4 shows a schematic diagram according to another embodiment of the invention. Referring to FIG. 4, the capacitive touch circuit 30 includes a reference voltage control unit 32, a comparator 14, a delay unit 16, and a relaxation oscillation control unit 22. This embodiment is similar to the above embodiment shown in FIG. 1, except their respective reference voltage control units are different and the resistance adjusting unit 18 is omitted from this embodiment. Further, the connection between different electronic components in this embodiment is similar to that in the above embodiment shown in FIG. 1, thus not explaining in detail here. In this embodiment, the reference voltage control unit 32 is electrically connected to the positive input terminal of the comparator 14 and includes a voltage source group switching controller 321, a high level voltage source group 322, a high level voltage selector 323, a first command source 324, a low level voltage source group 325, a low level voltage selector 326, and a second command source 327. The high level voltage source group 322 and the low level voltage source group 325 are both a multi-level voltage generation device. Taking the high level voltage source group 322 as an example, the high level voltage source group 322 has multiple different high reference voltages, and each high reference voltage corresponds to a switch 329. The first command source 324 determines a high reference voltage needed by the capacitive touch circuit 30, and the high level voltage selector 323 turns on one of the switches 329 to allow the selected high reference voltage to feed into the positive input terminal of the comparator 14. The high level voltage selector 323 and the low level voltage selector 326 both have a decoding circuit. The low level voltage source group 325 is also a multi-level voltage generation device, and its operation on the selection of low reference voltages is similar to the above embodiment, thus not explaining in detail here. The first and the second command sources may be implemented by firmware, software, or a DSP microprocessor.

The voltage source switching controller 321 electrically connects either the high level voltage source group 322 or the low level voltage source group 325 to the positive input terminal of the comparator 14 according to an output signal of the comparator 14. When the relaxation oscillation control unit 22 detects that an output voltage Vo of the comparator 14 is in a logic-high level, the relaxation oscillation control unit 22 outputs a logic-high voltage to charge the capacitance sensor 24. In comparison, when the relaxation oscillation control unit 22 detects that the output voltage Vo of the comparator 14 is in a logic-low level, the relaxation oscillation control unit 22 outputs a logic-low voltage to enable the capacitance sensor 24 to discharge. Hence, similar to the embodiment shown in FIG. 1, the voltage source group switching controller 321 switches between the high level voltage source group 322 and the low level voltage source group 325 to correspondingly perform charge and discharge operations.

Figure 5:
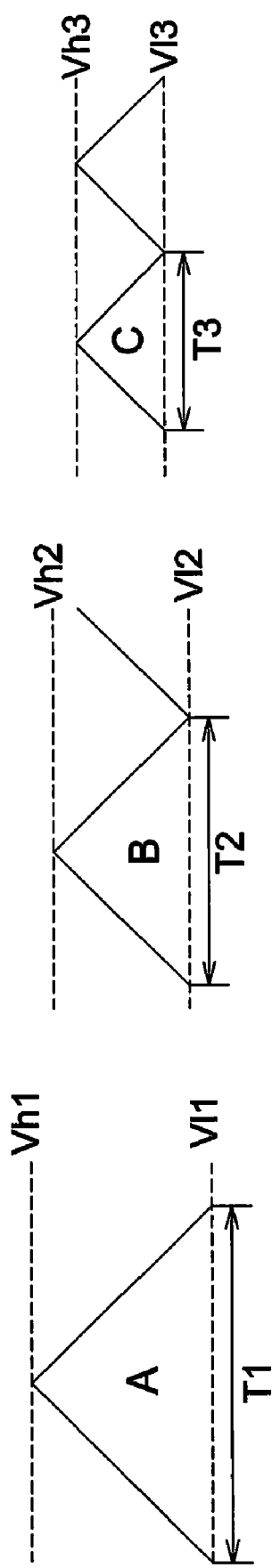
FIG. 5 shows a schematic diagram illustrating the effect of multi-level control according to an embodiment of the invention.

According to the multi-level design in this embodiment, the output waveform of the relaxation oscillation control unit 22 can be adjusted even the resistance adjusting unit 18 is omitted. FIG. 5 shows a schematic diagram illustrating the effect of multi-level control according to an embodiment of the invention. Referring to FIG. 5, Vh1, Vh2 and Vh3 indicate three high reference voltages (Vh1>Vh2>Vh3), and V11, V12 及 V13 indicate three low reference voltages (V11<V12<V13). Hence, the voltage differences satisfy the condition: (Vh1-V11)>(Vh2-V12)>(Vh3-V13). Even the slew rate of a relaxation oscillation signal keeps fixed because of a fixed RC constant, the amplitude and period of the relaxation oscillation signal can still be adjusted by varying the differences between selected high reference voltages and low reference voltages. More specifically, as shown in FIG. 5, the relaxation oscillation signal has a waveform A and a period T1 on the occasion of high level Vh1/low level V11, a waveform B and a period T2 on the occasion of high level Vh2/low level V12, and a waveform C and a period T3 on the occasion of high level Vh3/low level V13. Hence, though the waveforms A, B and C have an identical slew rate (due to a fixed RC constant), their amplitudes and periods are different (T1>T2>T3). As a result, the output frequency of a relaxation oscillation signal is allowed to be adjusted. Thereby, high and low reference voltages can be freely selected according to different environmental conditions and touch sensing applications to obtain an optimum frequency of the relaxation oscillation signal.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A capacitive touch circuit, comprising:
    a single comparator having a first input terminal, a second input terminal, and an output terminal;
    a reference voltage control unit electrically connected to the second input terminal, wherein the reference voltage control unit comprises:
        a high level voltage source;
        a low level voltage source; and
        a voltage switching controller electrically connecting either the high level voltage source or the low level voltage source to the second input terminal of the single comparator according to an output signal of the single comparator;
    a resistance adjusting unit electrically connected to the first input terminal of the single comparator;
    a delay unit electrically connected to the output terminal of the single comparator for filtering out the transition of the output signal, wherein the delay unit comprises:
        a delay time selector for deciding a delay time length according to the duration of the transition of the output signal of the single comparator; and
        a delay time adjuster for delaying the start of the transition of the output signal of the single comparator according to the delay time length; and
    a relaxation oscillation control unit electrically connected to the resistance adjusting unit, the delay unit, and the reference voltage control unit, wherein the relaxation oscillation control unit outputs a relaxation oscillation signal, the relaxation oscillation signal is fed into the first input terminal of the single comparator, and the frequency of the relaxation oscillation signal varies according to the resistance set by the resistance adjusting unit.

2. The capacitive touch circuit as claimed in claim 1, wherein the resistance adjusting unit comprises:
    an adjustable resistor, the adjustable resistor together with an external capacitance sensor constituting an RC circuit; and
    a resistance selector for setting the resistance of the adjustable resistor.

3. The capacitive touch circuit as claimed in claim 2, wherein the resistance selector has an N-bit (N is a positive integer) architecture to allow the adjustable resistor to have $2^N$ adjusting levels.

4. The capacitive touch circuit as claimed in claim 2, wherein the resistance selector is a read only memory (ROM), a random access memory (RAM), or a register.

5. The capacitive touch circuit as claimed in claim 2, wherein the relaxation oscillation control unit either charges the RC circuit or enables the RC circuit to discharge according to the output signal of the single comparator.

6. The capacitive touch circuit as claimed in claim 5, wherein the relaxation oscillation control unit outputs a logic-high voltage to charge the RC circuit when the output signal of the single comparator is in a logic-high level, and the relaxation oscillation control unit outputs a logic-low voltage to enable the RC circuit to discharge when the output signal of the single comparator is in a logic-low level.

7. The capacitive touch circuit as claimed in claim 5, wherein the output voltage of the high level voltage source is equal to an upper threshold voltage for charging the RC circuit, and the output voltage of the low level voltage source is equal to a lower threshold voltage for discharging the RC circuit.

8. The capacitive touch circuit as claimed in claim 7, wherein the voltage switching controller electrically connects the low level voltage source to the second input terminal of the single comparator at the instant when the voltage at the first input terminal increases to larger than the voltage at the second input terminal, and the voltage switching controller electrically connects the high level voltage source to the second input terminal of the single comparator at the instant when the voltage at the first input terminal decreases to smaller than the voltage at the second input terminal.

9. The capacitive touch circuit as claimed in claim 1 wherein the delay unit is a read only memory (ROM), a random access memory (RAM), or a register.

10. A capacitive touch circuit, comprising:
    a single comparator having a first input terminal, a second input terminal, and an output terminal;
    a reference voltage control unit electrically connected to the second input terminal, wherein the reference voltage control unit comprises:
        a high level voltage source group for providing multiple different high reference voltages;

a high level voltage selector for selecting one of the high reference voltages and feeding the selected high reference voltage into the second input terminal of the single comparator;

a low level voltage source group for providing multiple different low reference voltages;

a low level voltage selector for selecting one of the low reference voltages and feeding the selected low reference voltage into the second input terminal of the single comparator; and a voltage source group switching controller electrically connecting either the high level voltage source group or the low level voltage source group to the second input terminal of the single comparator according to an output signal of the single comparator;

a delay unit electrically connected to the output terminal of the single comparator for filtering out the transition of the output signal, wherein the delay unit comprises:

a delay time selector for deciding a delay time length according to the duration of the transition of the output signal of the single comparator; and a delay time adjuster for delaying the start of the transition of the output signal of the single comparator according to the delay time length; and a relaxation oscillation control unit electrically connected to the delay unit and the reference voltage control unit, wherein the relaxation oscillation control unit outputs a relaxation oscillation signal that is fed into the first input terminal of the single comparator, and the frequency and the amplitude of the relaxation oscillation signal vary according to a high reference voltage and a low reference voltage that are selected by the reference voltage control unit and fed into the second input terminal of the single comparator.

11. The capacitive touch circuit as claimed in claim 10, wherein the reference voltage control unit further comprises a command source that determines a high reference voltage and a low reference voltage needed by the capacitive touch circuit, and the command source orders the high level voltage selector to select the high reference voltage and the low level voltage selector to select the low reference voltage.

12. The capacitive touch circuit as claimed in claim 11, wherein the command source is implemented by firmware, software, or a microprocessor.

13. The capacitive touch circuit as claimed in claim 10, wherein both of the high level voltage selector and the low level voltage selector have a decoding circuit.

14. The capacitive touch circuit as claimed in claim 10, wherein the relaxation oscillation control unit either charges a capacitance sensor or enables the capacitance sensor to discharge according to the output signal of the single comparator.

15. The capacitive touch circuit as claimed in claim 14, wherein the relaxation oscillation control unit outputs a logic-high voltage to charge the capacitance sensor when the output signal of the single comparator is in a logic-high level, and the relaxation oscillation control unit outputs a logic-low voltage to enable the capacitance sensor to discharge when the output signal of the single comparator is in a logic-low level.

16. The capacitive touch circuit as claimed in claim 14, wherein the high reference voltage is equal to an upper threshold voltage for charging the capacitance sensor, and the low reference voltage is equal to a lower threshold voltage for discharging the capacitance sensor.

17. The capacitive touch circuit as claimed in claim 16, wherein the voltage source group switching controller electrically connects the low level voltage source group to the second input terminal of the single comparator at the instant when the voltage at the first input terminal increases to larger than the voltage at the second input terminal, and the voltage source group switching controller electrically connects the high level voltage source group to the second input terminal of the single comparator at the instant when the voltage at the first input terminal decreases to smaller than the voltage at the second input terminal.

18. The capacitive touch circuit as claimed in claim 10, wherein the delay unit is a read only memory (ROM), a random access memory (RAM), or a register.

* * * * *